(12) United States Patent
Gektin

(10) Patent No.: US 6,653,167 B2
(45) Date of Patent: Nov. 25, 2003

(54) FACILITATING HEAT TRANSFER FROM AN INTEGRATED CIRCUIT PACKAGE

(75) Inventor: Vadim Gektin, San Jose, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 124 days.

(21) Appl. No.: 09/950,204

(22) Filed: Sep. 10, 2001

(65) Prior Publication Data

US 2003/0047803 A1 Mar. 13, 2003

(51) Int. Cl.[7] ............................................. H01L 21/50
(52) U.S. Cl. ...................... 438/106; 438/122; 438/124; 438/127
(58) Field of Search ........................ 438/122, 106, 438/124, 126, 127

(56) References Cited

U.S. PATENT DOCUMENTS

| 4,918,571 | A | * | 4/1990 | Grabbe ........................ 361/718 |
| 5,123,849 | A | * | 6/1992 | Deak et al. ..................... 439/66 |
| 5,201,451 | A | * | 4/1993 | Desai et al. ................. 228/5.5 |
| 5,227,663 | A | * | 7/1993 | Patil et al. ................... 257/718 |
| 5,311,060 | A | * | 5/1994 | Rostoker et al. ............. 257/796 |
| 5,404,273 | A | * | 4/1995 | Akagawa ..................... 361/707 |
| 5,585,671 | A | * | 12/1996 | Nagesh et al. ............... 257/697 |
| 5,661,902 | A | * | 9/1997 | Katchmar ..................... 29/840 |
| 5,926,371 | A | * | 7/1999 | Dolbear ....................... 361/704 |

* cited by examiner

Primary Examiner—Trung Dang
(74) Attorney, Agent, or Firm—Hamilton & Terrile, LLP; Stephen A. Terrile

(57) ABSTRACT

In accordance with the present invention, a method is described which facilitates heat transfer from a silicon die after the silicon die is bonded to a substrate. The thermal conductor is placed on the silicon layer after the silicon layer has been bonded to the substrate layer. A spacer is used between the substrate and the thermal conductor. The spacer can facilitate heat transfer from the die. The spacer facilitates force transfer from the thermal conductor to the die. In an embodiment, the thermal conductor can be removed and a second thermal conductor used to further facilitate heat transfer. In an enablement, a heat sink and heat sink interface are provided and further facilitate heat transfer from the package. The specification also teaches an integrated circuit package manufactured by the method taught. The specification also teaches a computer system including an integrated circuit package manufactured by the method taught.

11 Claims, 10 Drawing Sheets

FACILITATING HEAT TRANSFER FROM AN INTEGRATED CIRCUIT PACKAGE

CROSS-REFERENCE TO RELATED APPLICATIONS

This application relates to U.S. patent application Ser. No. 09/865,903, filed May 25, 2001, entitled "A Method to Place a Thermal Interface when Manufacturing an Integrated Circuit" naming Vadirn Gektin as inventor, which is assigned to the assignee of this application, the application being hereby incorporated b reference in its entirety.

This application relates to U.S. patent application Ser. No. 09/965,704, filed on Sep. 26, 2001, entitled "Alignment of Silicon Die" naming Vadim Gektin as inventor, which is assigned to the assignee of this application, the application being hereby incorporated by reference in its entirety.

BACKGROUND OF THE INVENTION

1. Field of the Invention

The present invention relates to assembling an integrated circuit package. More specifically, the invention relates to facilitating heat and force transfer between the integrated circuit package after a silicon layer has been bonded to the substrate.

2. Description of the Related Art

Digital circuits, no matter how complex, are composed of a small group of identical building blocks. These blocks can be gates or special circuits or other structures for which gates are less suitable. But the majority of digital circuits are composed of gates or combinations of gates. Gates are combinations of high-speed electronic switches such as transistors.

A microprocessor is a central processing unit of a computer or other device using thousands (or millions) of gates, flip-flops and memory cells. Flip-flops and memory cells are modified versions of basic logic gates.

It is known to manufacture an integrated circuit using conductors separated by a semiconductor. Circuits are fabricated on a semiconductor by selectively altering the conductivity of the semiconductor material. Various conductivity levels correspond to elements of a transistor, diode, resistor, or small capacitor. Individual components such as transistors, diodes, resistors, and small capacitors are formed on small chips of silicon. These individual components are interconnected by wiring patterns (typically aluminum, copper or gold).

An integrated circuit is then included in a larger structure, known as integrated circuit package, that provides electrical connections between the integrated circuit and the next level assembly. The integrated circuit package also serves structural functions. Integrated circuit packages are then mounted on printed (or wired) circuit boards which are used to assemble electronic systems such as personal computers and other data processing equipment.

It is known to manufacture an integrated circuit package using a layer of silicon and a layer of a substrate. The substrate layer can be ceramic or another material with the necessary electrical insulating properties, such as a ceramic. Heat is applied during the manufacturing process to bond the silicon layer to the substrate layer. Uneven cooling of the silicon and substrate layers (sometimes referred to as the "package") could produce failures in the package. Uniform cooling minimizes the number of failures in the package.

After bonding the silicon layer to the substrate layer a heat spreader (sometimes referred to as a "thermal lid" or simply a "lid") is attached to the package. The thermal lid serves to conduct heat from the integrated circuit package to the environment and thus facilitates even cooling. The lid is typically formed from a metal due to the high thermal conductivity of metals. Typically, neither the thermal lid nor the silicon surface are sufficiently flat to provide an efficient heat exchange interface. Thus, imperfections in the surface of the thermal lid and the surface of the silicon prevent complete surface contact between the surface of the silicon and the surface of the thermal lid. The incomplete surface contact is an impediment to heat transfer which in turn causes failures of the package.

The lid can be used in conjunction with a heat sink. The heat sink is provided with fins or other external surfaces to increase contact with ambient air. The increased contact with the ambient air further facilitates heat transfer.

The lid also serves to promote even transfer of forces to the package. Even transfer of force to the package prevents force concentrations on the silicon layer, substrate or in some circumstances the printed circuit board. Even force transfer also reduces failures of the package.

To facilitate surface contact between the thermal lid and the silicon surface a thermal interface (sometimes referred to as a "die interface") is employed. The die interface can be applied to the surface of the silicon before the thermal lid is attached. The die interface is not necessarily a solid and can conform to imperfections in the surface of the silicon. Similarly, the die interface can conform to imperfections in the surface of the thermal lid. Thus, using a die interface increases the surface contact between the silicon and the thermal lid and promotes heat transfer.

The increased surface contact between the silicon surface and lid has an additional benefit. When the lid is applied to the silicon layer a force is transferred. If the force is not uniformly transferred, imperfections in the silicon surface can result. Failures of the silicon surface can result in rejected packages or later failures.

When a heat sink is employed it is also known to utilize a heat sink interface. Similar in material characteristic to a die interface, a heat sink interface is not necessarily a solid but can also be a viscous liquid. Similar in function to a die interface, a heat sink interface also improves heat transfer properties by improving surface contact between the heat sink and the lid. Similar to the die interface the heat sink interface improves force transfer by increasing surface contact between the heat sink and the lid.

An example of a material that is suitable for use as an interface is manufactured by Thermagon of Cleveland, Ohio. This specific material, referred to as T-lma-60, has suitable thermal conductive properties and can be used as a thermal interface. T-lma-60 can have more than one layer and is a thermal conductive structure phase change material. T-lma-60 changes phase from solid to liquid at approximately 60° C. A thermal interface, such as T-lma-60 or other, can have a plurality of layers. For example, a thermal interface such as T-lma-60 can have three layers, one of which can be a metallic central layer.

FIG. 1A depicts substrate 120 adjacent to printed circuit board (sometimes referred to as "pcb") 110. Silicon die 130 is bonded to substrate 120 as previously discussed. Die interface 150 is typically a non-solid used to facilitate heat transfer between silicon die 130 and lid 140. Lid 140 contacts heat sink interface 160 as shown. Heat sink interface 160 contacts heat sink 170 as shown. Lid interface 180 is used to facilitate heat transfer between silicon die 130 and substrate 120. FIG. 1B depicts a thermal lid with a cavity depth of zero. As depicted in FIG. 1B, lid interface 180 is not typically used for applications having a zero cavity thermal lid due to the lack of surface contact between thermal lid 140 and substrate 120.

FIG. 2A depicts the logical steps of placing die interface 150 on silicon die 130. As shown in FIG. 2A, the method begins with start 210. From start 210 the logical steps include providing substrate, providing silicon die 220 and providing thermal lid 240. After providing silicon die 220 and providing substrate 230 the silicon die 130 and substrate 120 are bonded, 250. Provide thermal lid 240 is shown occurring prior to bonding (250) silicon die 130 to substrate 120 but can occur later. After providing thermal lid 240 die interface is placed (260) on silicon die 130. After die interface is placed on silicon die 130 lid interface 180 is placed (265) on substrate 120. After lid interface is placed (265) on substrate, thermal lid 140 is placed on die interface 150 and lid interface 180. In one method, after the thermal lid and thermal interface are placed on the silicon layer 270, the process ends 295.

Another embodiment represented in FIG. 2B. In the embodiment represented in FIG. 2B, heat sink 170 is provided, 255. When a heat sink is provided heat sink interface 160 is also provided, 265. As shown in FIG. 2B, heat sink interface 160 is placed (280) on thermal lid 140 after the thermal lid is placed (270) on the silicon die. As further shown in FIG. 2B, heat sink 170 is placed (290) on thermal interface 160 after heat sink interface 160 is placed (280) on the thermal lid.

Although FIG. 2B depicts providing heat sink 170 and heat sink interface 160 after bonding (250) heat sink 170 and heat sink interface 160 can be provided earlier or later in the process. For example, referring to FIG. 2C, providing heat sink 255 and providing the heat sink interface 265 occur after placing (260) die interface on silicon die.

Each of the following components contribute to the total thermal resistance of the package: heat sink, heat sink interface, thermal lid, die interface, silicon die and substrate. Thus heat transfer is constrained by the number of components and the thermal conductivity and physical characteristics (such as thickness) of those components. What is needed is a method of improving the thermal conductivity of these components, or reducing the number (or thickness) of the components.

SUMMARY OF THE INVENTION

In accordance with the present invention, a method is described which facilitates heat transfer from a silicon die after the silicon die is bonded to a substrate. A thermal conductor, (e.g. a heat exchanger, heat sink, thermally conductive lid or other means) is placed on the silicon layer after the silicon layer has been bonded to the substrate layer. A spacer is used between the substrate and the thermal conductor. The spacer can facilitate heat transfer from the die. The spacer facilitates force transfer from the thermal conductor to the die. In an embodiment, the thermal conductor can be removed and a second thermal conductor used to further facilitate heat transfer. In an enablement, a heat sink and heat sink interface are provided and further facilitate heat transfer from the package.

The specification also teaches an integrated circuit package manufactured by the method taught. The specification also teaches a computer system including an integrated circuit package manufactured by the method taught.

The foregoing is a summary and thus contains, by necessity, simplifications, generalizations and omissions of detail; consequently, those skilled in the art will appreciate that the summary is illustrative only and is not intended to be in any way limiting.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 2A depicts the logical steps of the related art of placing a die interface on the silicon die before the thermal lid is placed.

FIG. 4A depicts the logical steps of placing a lid interface on the substrate and placing a spacer and the thermal lid (without die interface) on the silicon die.

DETAILED DESCRIPTION

The following sets forth a detailed description of a mode for carrying out the invention. The description is intended to be illustrative of the invention and should not be taken to be limiting. A method is taught of placing a thermal conductor (e.g. a heat sink, thermally conductive lid, heat radiator or other means) without a thermal interface on the silicon die. A spacer is used to maintain the tolerances required for conductive cooling of the silicon die. Omitting the die interface from between the silicon die and the thermal conductor positions upper surfaces of the silicon die and the spacer at a predetermined height variance, including a zero variance. In an embodiment, the thermal conductor can be removed and a second thermal conductor used to further facilitate heat transfer. Increasing thermal transfer from the silicon die cools the die more efficiently and reduces thermally-driven failures. Also, using the spacer maintains force distribution from the thermal conductor to the die and substrate.

Figure 1A:
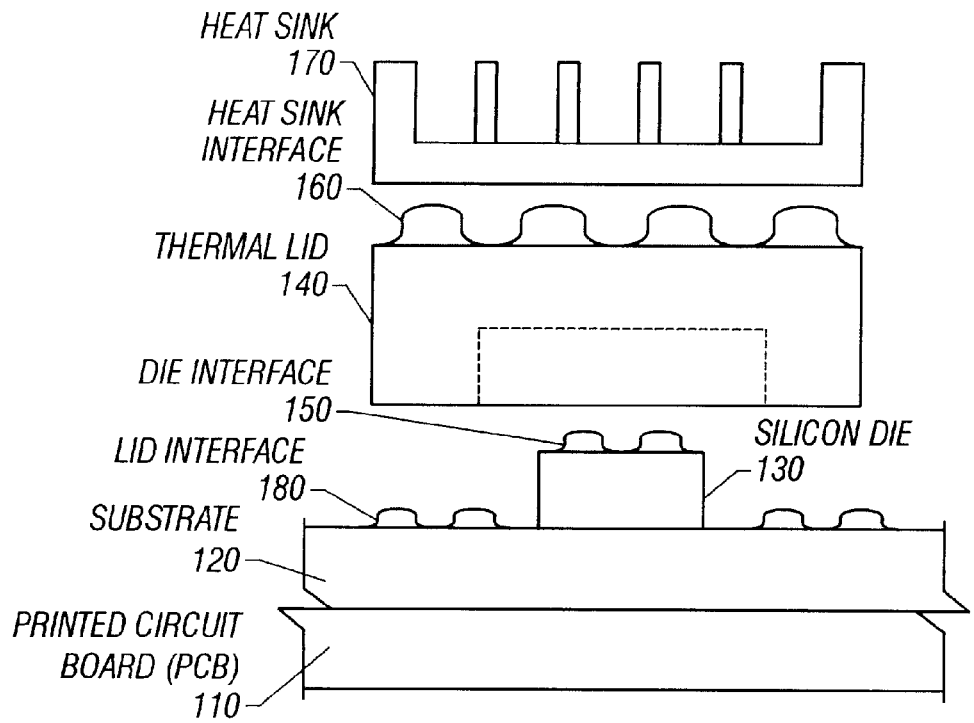
FIG 1A depicts the related art of placing an organic thermal interface on a silicon layer after the silicon layer is bonded to the substrate.
Figure 1B:
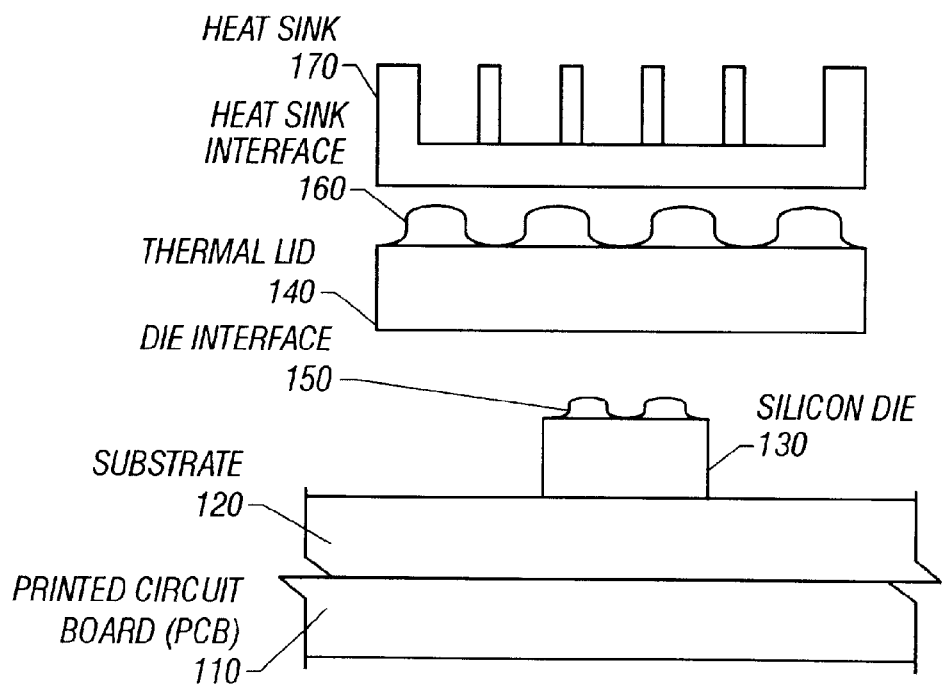
FIG. 1B depicts the related art of placing an organic thermal interface on a silicon layer (as previously shown in FIG. 1A) using a zero-cavity thermal lid.
Figure 3A:
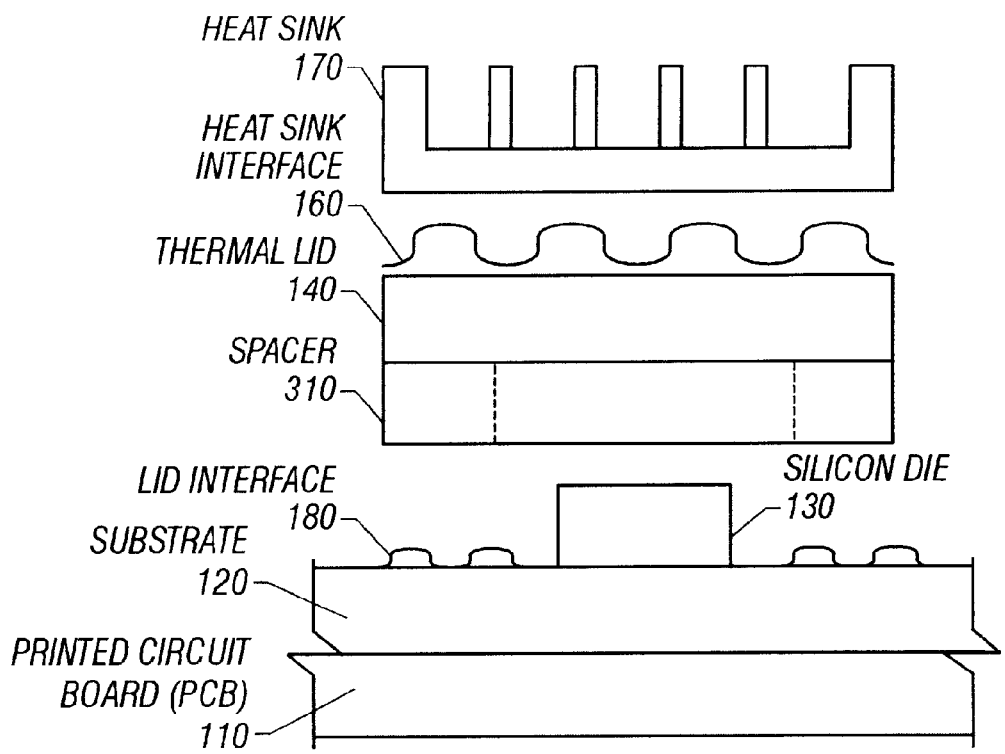
FIG. 3A depicts placing a thermal lid and spacer on the silicon die without using a die interface.

FIG. 3A depicts printed circuit board 110 and substrate 120 previously shown in FIG 1A. FIG. 3A also depicts spacer 310 and thermal lid 140 as previously shown in FIG. 1A. However, FIG. 3A is not limiting. For example thermal lid 140 can be any thermal conductor such as a heat exchanger or heat sink 160 (previously shown in FIG. 1A).

FIG. 3A also depicts heat sink interface 160 and heat sink 170 as previously shown in FIG. 1A. However, FIG. 3A does not depict a die interface between silicon die 130 and thermal lid 140. Located between silicon die 130 and thermal lid 140 FIG. 3A depicts spacer 310. Spacer 310 is a solid suitable for transmitting a force from thermal lid 140 (or heat sink 170) to substrate 120. Typically, spacer 310 is expected to be metallic or an alloy, but spacer 310 can be any suitable solid. Spacer 310 does not necessarily conduct heat from the silicon die. Therefore, the material for thermal conductivity of spacer 310 is not limited to materials having a high (or low) thermal conductivity. However, spacer 310 shall be of a material suitable to transfer a force from thermal lid 140 (or heat sink 170) to substrate 120.

Figure 3B:
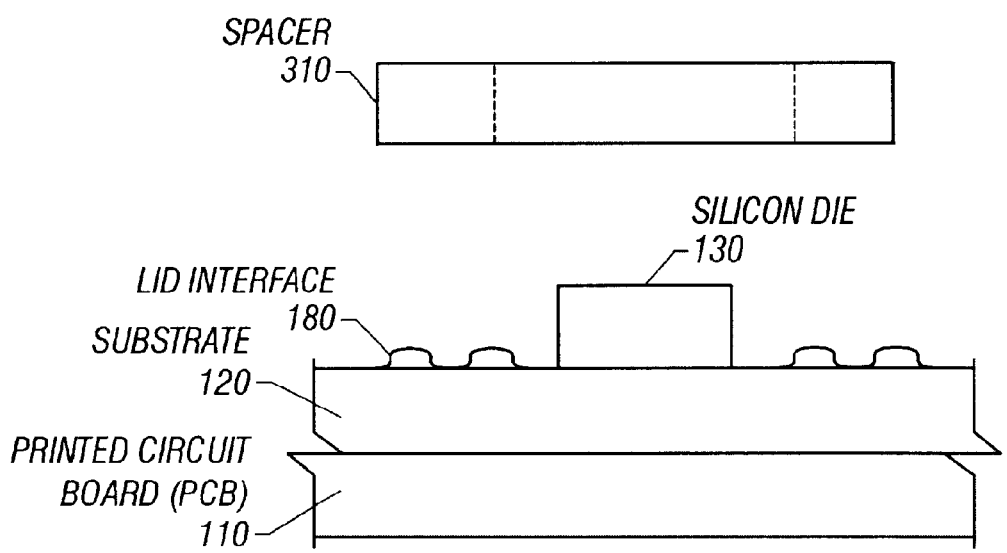
FIG. 3B again depicts placing a spacer on the silicon die without using a thermal lid as previously shown in FIG. 3A.

FIG. 3B depicts silicon die 130 and spacer 310 on substrate 120 as previously depicted in FIG. 3A. However, for clarity heat sink 170, heat sink interface 160 and thermal lid 140 are not shown in FIG. 3B. When spacer 310 is placed on substrate 120 the top surface of silicon die 130 and spacer 310 will be at substantially the same elevation. Alternatively, the top of silicon die 130 and spacer 130 can be at a predefined variance. Maintaining the top surface of spacer 310 and the top surface of silicon die 130 at the same elevation (or at a predefined variance) enhances the heat transfer from silicon die 130 to heat sink 170 (not shown) as previously shown in FIG. 3A.

Figure 4A:
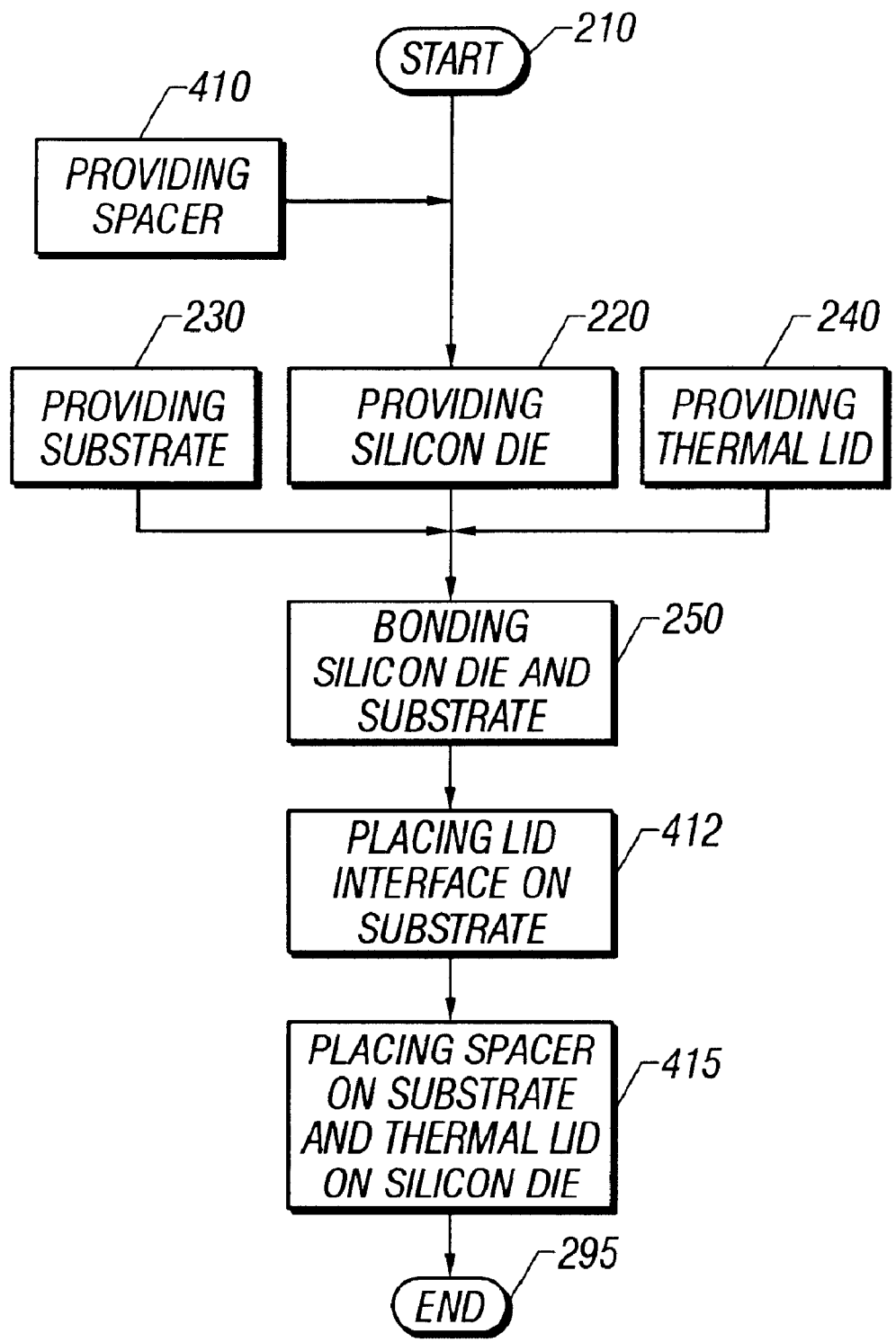
FIG. 4A depicts a process flow diagram depicting logical steps of an embodiment. Specifically.

FIG. 4A depicts the step of providing spacer 410, not previously shown. However, FIG. 4A does not show the step of placing die interface on silicon die 260 as previously shown in FIG. 2A (and FIG. 2B and FIG. 2C). Providing spacer 410 is shown occurring before bonding silicon die and substrate 250. But providing spacer 410 can occur at another suitable time in the method.

Figure 2A:
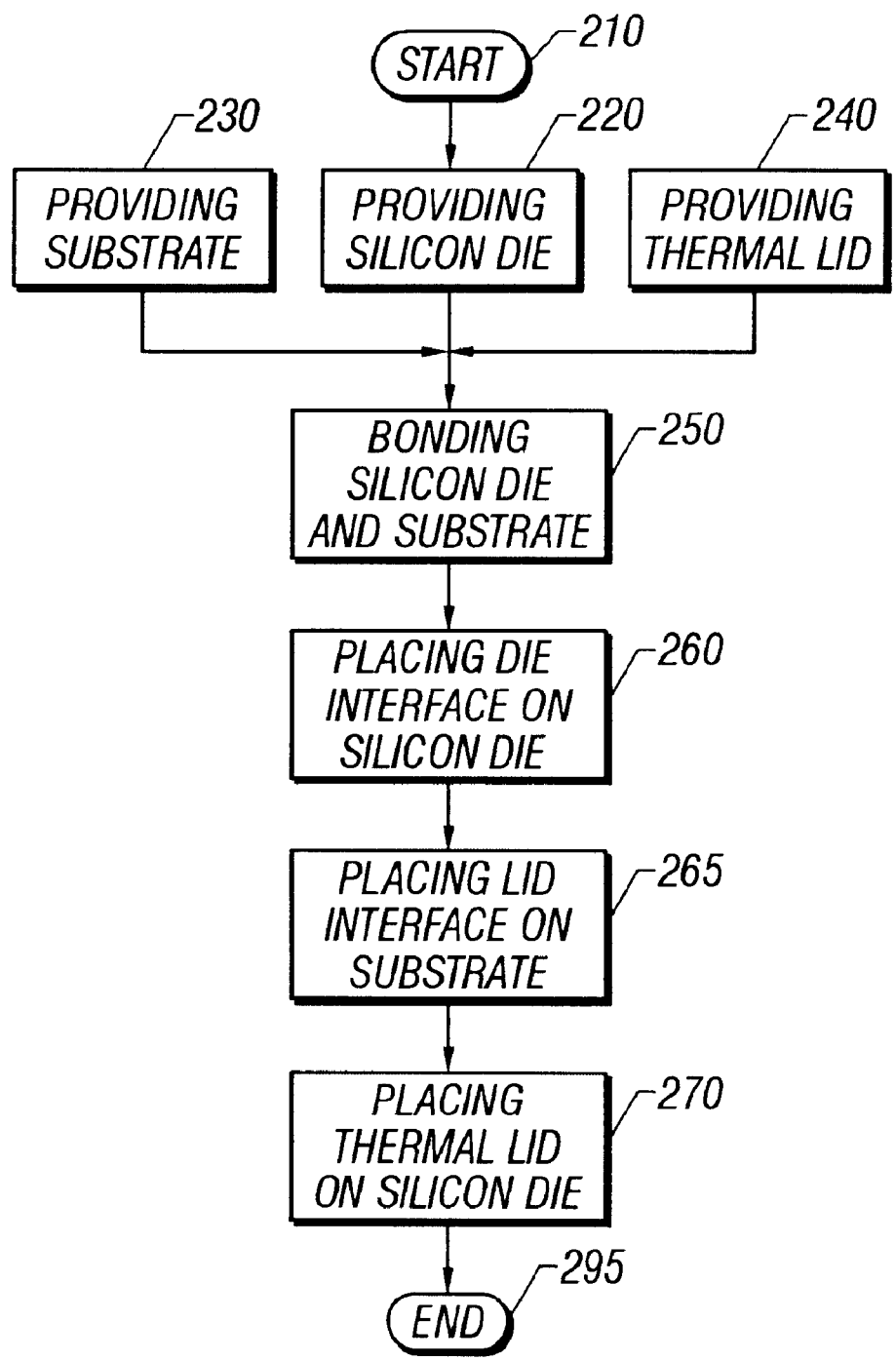
FIG. 2A depicts a process flow diagram depicting logical steps of the related art. Specifically.
Figure 2B:
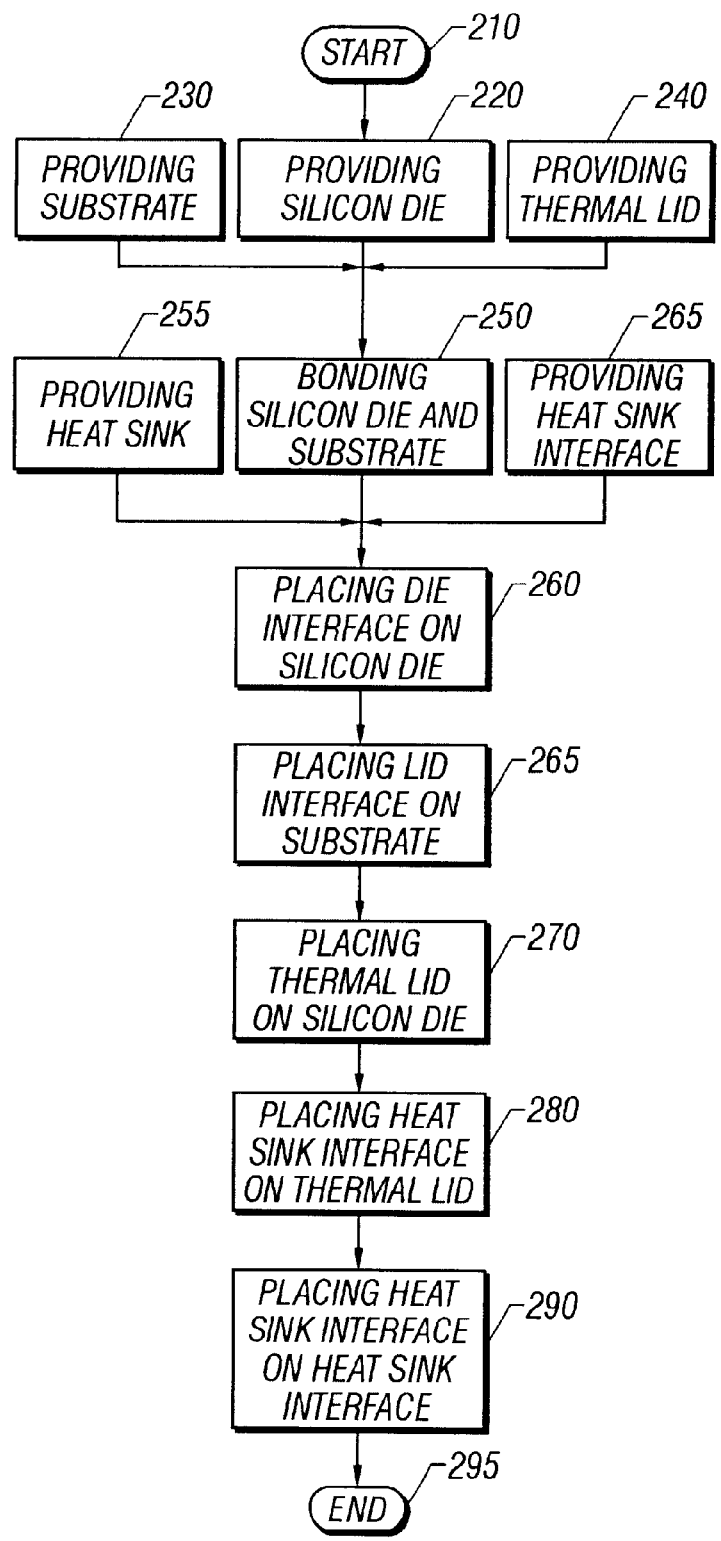
FIG. 2B depicts another step in the method previously shown in FIG. 2A, placing a heat sink and heat sink interface on a thermal lid.
Figure 2C:
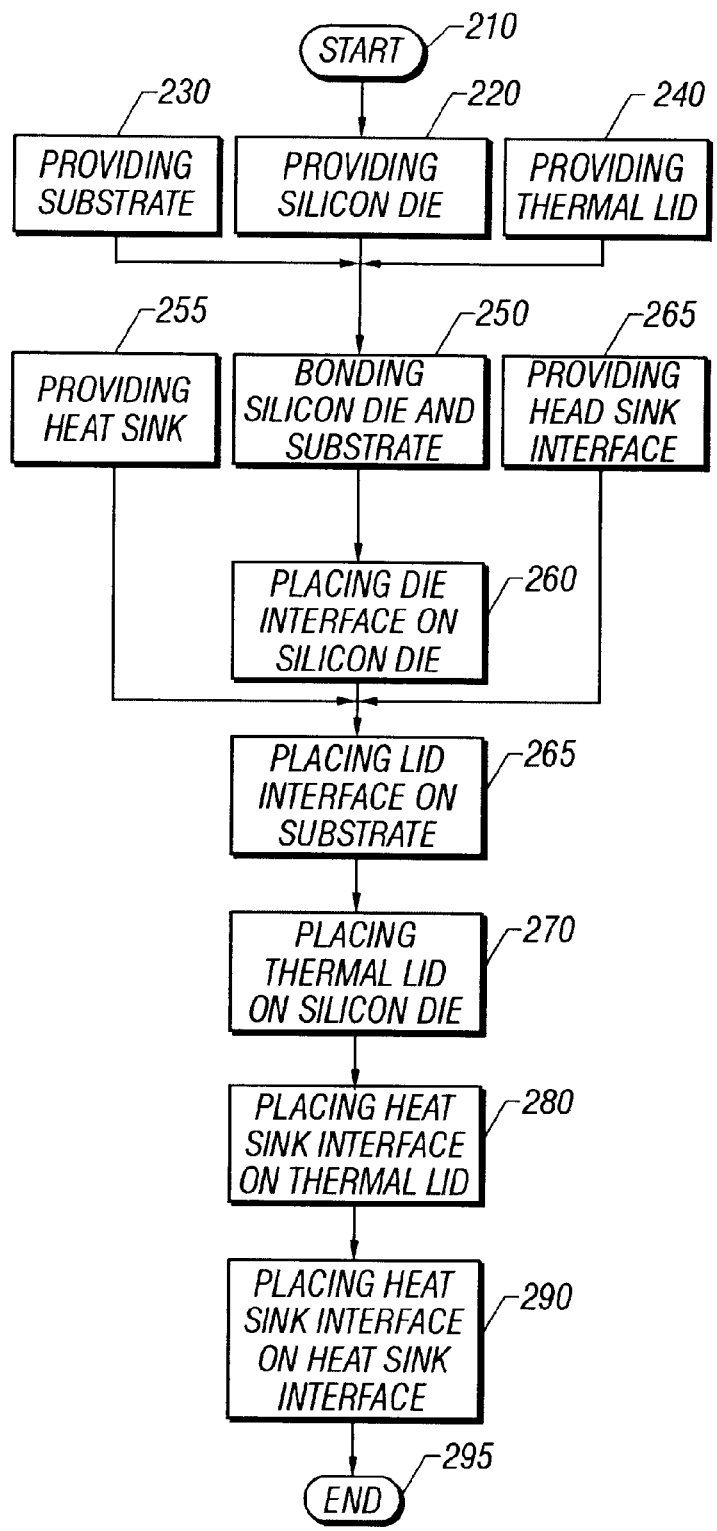
FIG. 2C depicts an enablement of the related art placing the heat sink and heat sink interface on a thermal lid (as previously shown in FIG. 2B) after placing the die interface on the silicon die.
Figure 4B:
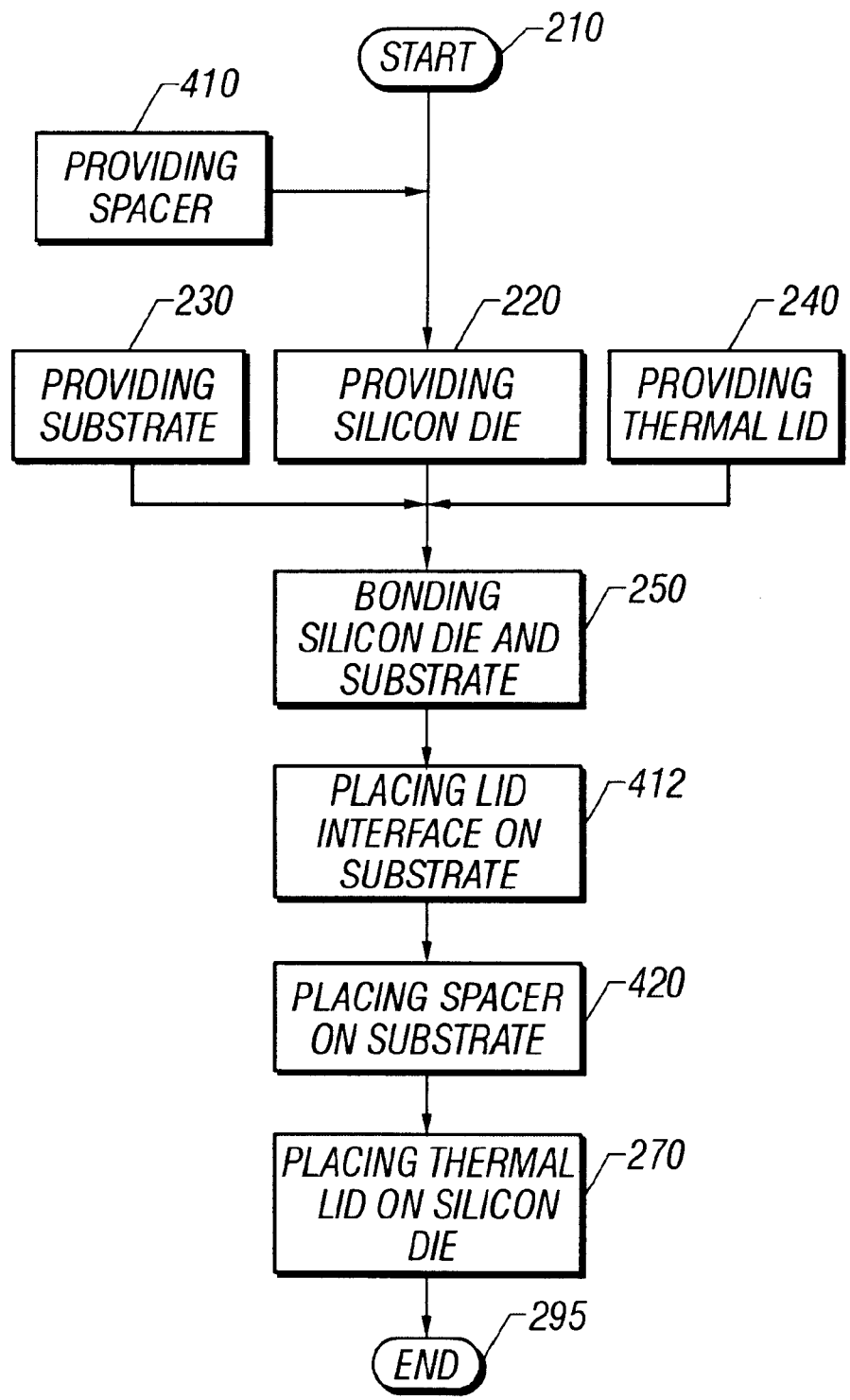
FIG. 4B depicts a process flow diagram (as previously shown in FIG. 4A) of placing a thermal lid on the silicon die and placing a spacer on a substrate in separate steps.

FIG. 4A also depicts the logical step of placing a spacer around a silicon die without use of die interface 150 (previously shown in FIGS. 2A–2C). Thus, FIG. 4A shows steps previously shown in FIG. 2A such as providing silicon die 220, providing substrate 230, providing thermal lid 240 and bonding silicon die and substrate 250. From providing substrate 230, providing silicon die 220 and providing thermal lid 240 the method proceeds to bonding silicon die and substrate, 250. From bonding silicon die and substrate 250 the method proceeds to placing lid interface on substrate, 412. From placing lid interface on substrate (412) the method proceeds to placing spacer on substrate and thermal lid on silicon die, 415. The thermal lid and the spacer can be placed as one component on the substrate as shown in FIG. 4A. Alternatively, as shown in FIG. 4B, placing the spacer on the substrate and placing thermal lid on the silicon die can occur separately. Operably disposing the spacer on the substrate positions the spacer adjacent to the silicon die. Still referring to FIG. 4A, after the spacer is placed on the substrate and thermal lid is placed on the silicon die (415) the process ends, 295.

FIG. 4B depicts the method as shown in FIG. 4A, but placing the spacer on the substrate (420) and placing the thermal lid on the silicon die (270) in separate steps. (In comparison, as shown in FIG. 4A the thermal lid and spacer can be placed contemporaneously.) After bonding the silicon die and substrate (250) the method can proceed to placing lid interface on the substrate, 412. From placing the lid interface on the substrate (412) the method can proceed to placing the spacer on the substrate, 420. From placing spacer on the substrate (420) the method can proceed to placing the thermal lid on the silicon die, 270. From placing the thermal lid on the silicon die (270) the method can end, 295.

Figure 4C:
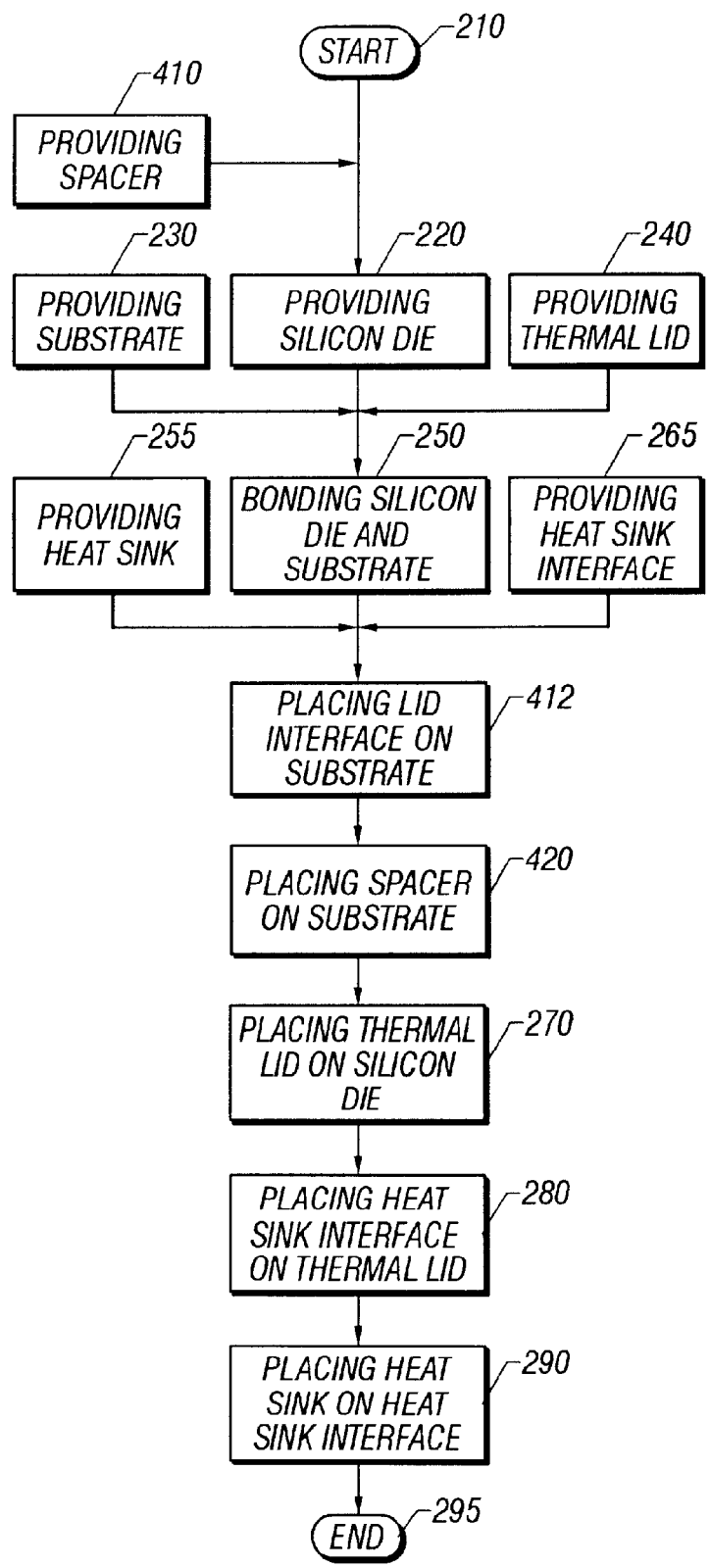
FIG. 4C depicts the logical process (as previously shown in FIG. 4B) with the additional logical steps of providing a heat sink and providing a heat sink interface.

FIG. 4C depicts the logical steps of placing a spacer around a silicon die (which is disposed on a substrate) as previously depicted in FIG. 4B. However, FIG. 4C depicts additional logical steps in an enablement of the method. More specifically, FIG. 4C depicts providing a heat sink 255 and providing heat sink interface 265. FIG. 4C depicts placing heat sink interface on thermal lid, 280 after placing spacer on the substrate 420 and placing thermal lid on silicon die, 270. (As noted previously, refer to FIG. 4A, placing spacer on substrate 420 and placing thermal lid on silicon die 270 can be performed contemporaneously.) In the next logical step FIG. 4C depicts placing the heat sink on the heat sink interface, 290. In this embodiment, after placing the heat sink on the heat sink interface (290) the process ends, 295.

Figure 4D:
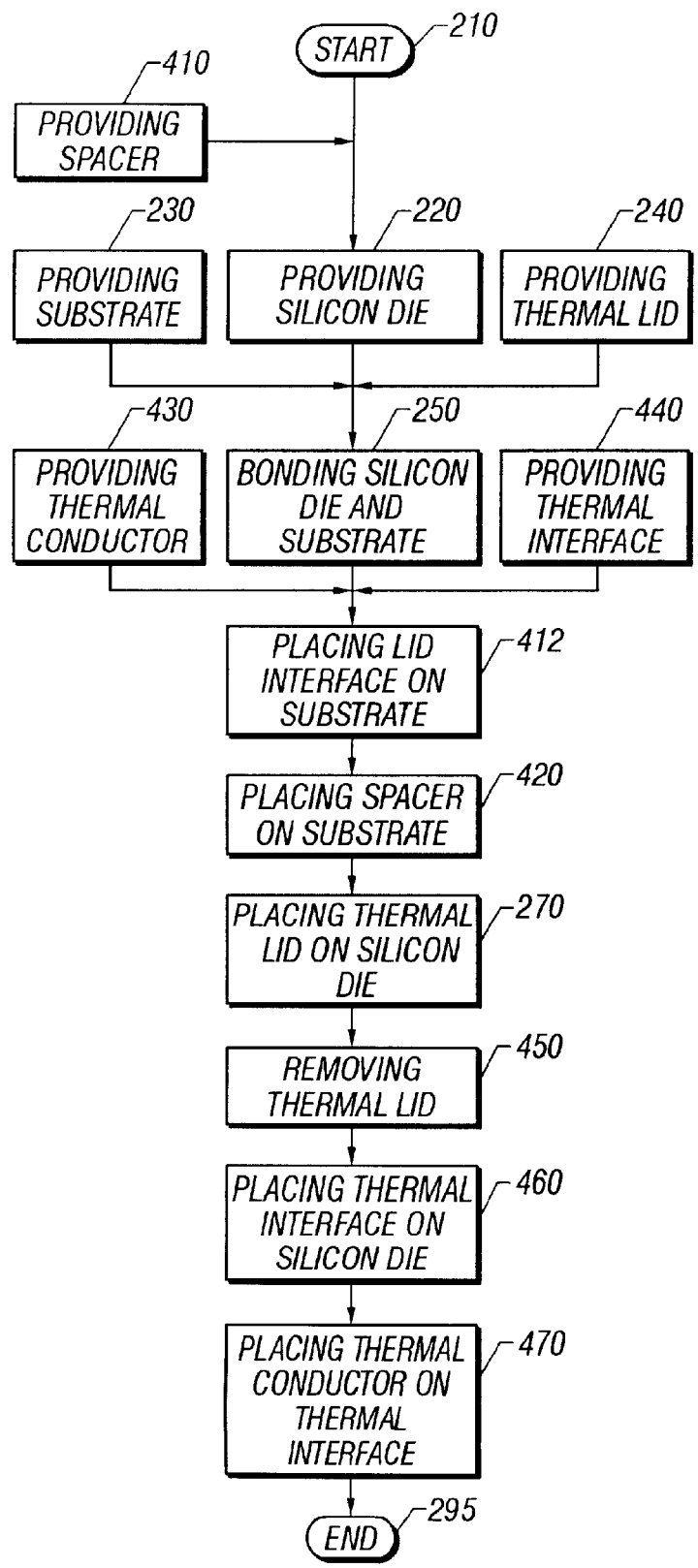
FIG. 4D shows a process flow diagram of removing a thermal lid and placing an additional thermal conductor on the silicon die.

FIG. 4D shows a flow diagram of an embodiment of the disclosure. FIG. 4D shows steps previously shown in FIG. 4C including; providing a spacer 410, providing substrate 230, providing silicon die 220 and providing thermal lid, 240. FIG. 4D does not show providing heat sink (255) or providing heat sink interface (previously shown in FIG. 2). FIG. 4D shows providing thermal conductor 430 and providing thermal interface 440. The thermal conductor provided in step 430 can be a heat exchanger, heat sink or any other suitable device for radiating heat. Similarly, the thermal interface provided in step 440 can be a thermal interface similar to the heat sink interface taught previously (refer to step 265 in FIG. 2). Alternatively, the thermal interface provided in step 440 can be any thermal interface suitable for this application.

From bonding silicon die and substrate 250 (shown previously in FIG. 4C) the method proceeds to placing lid interface on substrate, 412. From placing lid interface on substrate (412) the method proceeds to placing spacer on substrate, 420 (previously shown in FIG. 4C). From placing spacer on substrate (420) the method proceeds to placing thermal lid on silicon die (also previously shown in FIG. 4C). From placing thermal lid on silicon die (270) the method proceeds to removing the thermal lid. The method proceeds from removing thermal lid 450 to placing thermal interface on silicon die, 460. The method proceeds from placing thermal interface on silicon die (460) to placing thermal conductor on thermal interface, 470. The thermal conductor placed in step 470 can be similar to the thermal lid. Alternative the thermal conductor can be a heat sink or any other suitable heat exchanger. From step 470 the method can end, 295.

Placing a second thermal conductor on the silicon die allows improved heat transfer away from the silicon die. Typically a thermal interface is used between the later-placed thermal conductor and the silicon die. The application of thermal interface after the thermal lid is removed can be as shown by step 460 in FIG. 4D. However, this step is optional. In an embodiment the later-placed thermal conductor can be placed directly on the silicon die.

An Example of a Computer System

The present disclosure is applicable to any integrated circuit including data processing systems. Integrated circuits may be found in many components of a typical computer system, for example a central processing unit, memory, cache, audio controller, network interface, I/O controller and I/O device as shown in the example below. Integrated circuits are found in other components within a computer system such as a display monitor, keyboard, floppy and hard disk drive, DVD drive, CD-ROM and printer. However, the example of a computer system is not taken to be limiting. Integrated circuits are ubiquitous and are found in other electrical systems such as stereo systems and mechanical systems including automobiles and aircraft.

Figure 5:
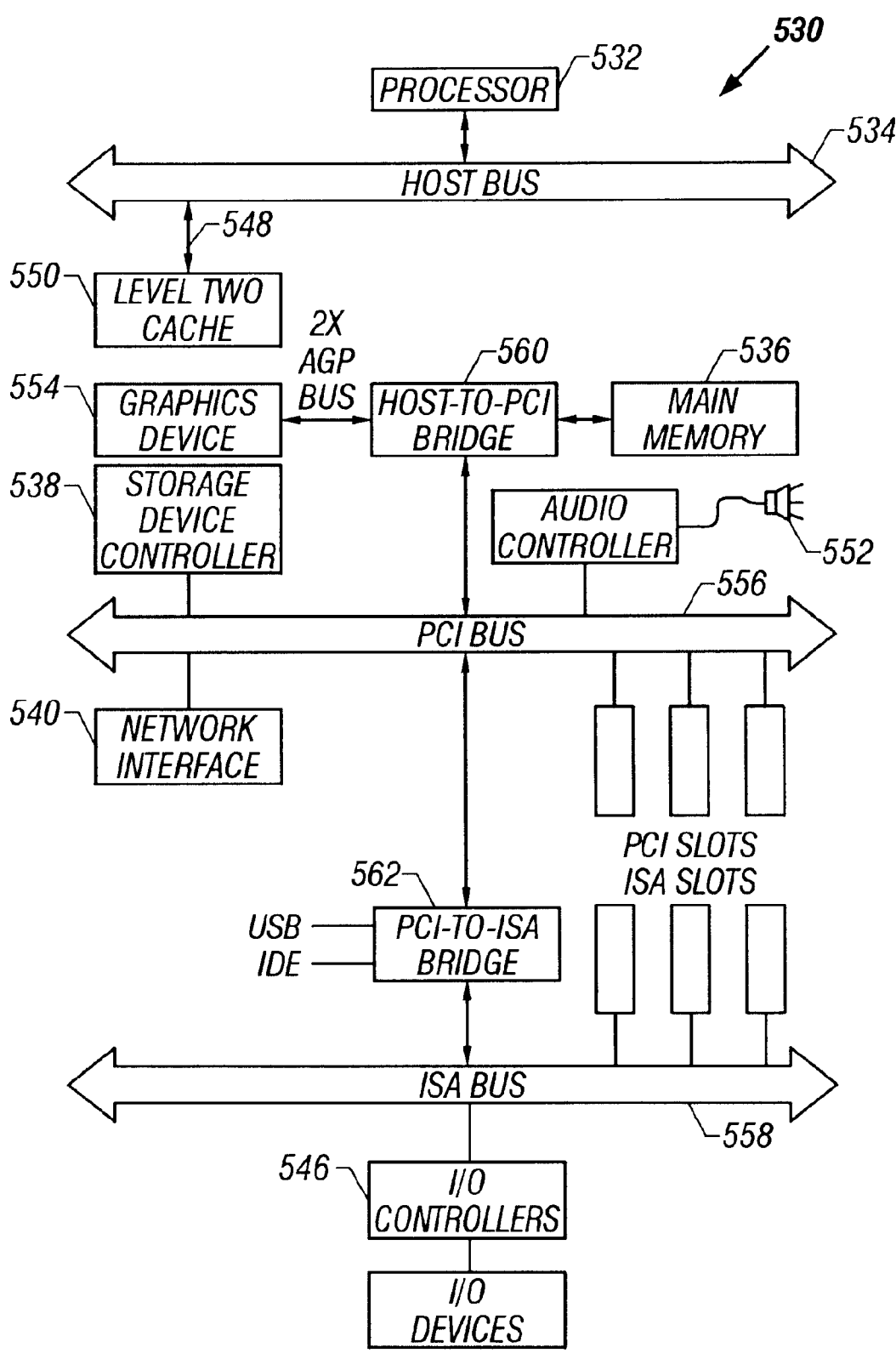
FIG. 5 is a block diagram of a computer system. The computer system incorporates various components (central processing unit, memory, etc.) which are integrated circuits which may be manufactured fabricated using the method taught.

Referring to FIG. 5, computer system 530 includes central processing unit (CPU) 532 connected by host buss 534 to various components including main memory 536, storage device controller 538, network interface 540, audio and video controllers 542, and input/output devices 544 connected via input/output (I/O) controllers 546.

Typically computer system 530 also includes cache memory 550 to facilitate quicker access between processor 532 and main memory 536. I/O peripheral devices often include speaker systems 552, graphics devices 554, and other I/O devices 544 such as display monitors, keyboards, mouse-type input devices, floppy and hard disk drives, DVD drives, CD-ROM drives, and printers. Many computer systems also include network capability, terminal devices, modems, televisions, sound devices, voice recognition devices, electronic pen devices, and mass storage devices such as tape drives. The number of devices available to add to personal computer systems continues to grow, however computer system 630 may include fewer components than shown in FIG. 5 and described herein. The peripheral devices usually communicate with processor 532 over one or more buses 534, 556, 558, with the buses communicating with each other through the use of one or more bridges 560, 562.

Those of skill in the art will recognize that, based upon the teachings herein, several modifications may be made to the embodiments shown in FIGS. 1–5. For example, those skilled in the art will recognize that incorporating integrated circuits manufactured by the process shown in electrical systems other than computers systems is incorporated in the spirit and scope of the invention.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of facilitating heat transfer from a silicon die during manufacture of an integrated circuit package, comprising:

bonding a silicon die to a substrate;

operably disposing a spacer on the substrate about the silicon die; and placing a first thermal conductor on the silicon die wherein the first thermal conductor and the silicon die are in direct surface contact;

wherein the spacer and first thermal conductor are placed on the substrate substantially simultaneously.

2. The method as recited in claim 1, wherein the spacer is substantially circular.

3. The method as recited in claim 1, wherein the spacer is non-metallic.

4. A method of facilitating heat transfer from a silicon die during manufacture of an integrated circuit package, comprising:

bonding a silicon die to a substrate;

operably disposing a spacer on the substrate about the silicon die; and placing a first thermal conductor on the silicon die wherein the first thermal conductor and the silicon die are in direct surface contact;

wherein the spacer and first thermal conductor are placed on the substrate substantially simultaneously;

removing the first thermal conductor from the silicon die;

operably disposing a thermal interface on the silicon die; and operably disposing a second thermal conductor on the thermal interface.

5. The method as recited in claim 1, wherein the first thermal conductor is a thermally conductive lid.

6. The method as recited in claim 1, wherein the first thermal conductor is a heat sink.

7. A method of facilitating heat transfer from a silicon die during manufacture of an integrated circuit package, comprising:

bonding a silicon die to a substrate;

providing a means for maintaining a spacing between the substrate and a thermal conductor;

operably disposing the means for maintaining a spacing between the substrate and a thermal conductor;

placing a first thermal conductor on the silicon die wherein the first thermal conductor and die interface are in direct contact;

removing the first thermal conductor from the silicon die;

operably disposing a thermal interface on the silicon die; and operably disposing a second thermal conductor on the thermal interface.

8. The method as recited in claim 7, wherein the thermal conductor is a thermally conductive lid.

9. The method as recited in claim 7, wherein the thermal conductor is a heat sink.

10. The method as recited in claim 7, wherein the means for maintaining a spacing between the substrate and the thermal conductor lid is a substantially circular means.

11. A method of facilitating force transfer from a thermal conductor to a silicon die during manufacture of an integrated circuit package, comprising:

bonding a silicon die to a substrate;

providing a means for transferring force from a thermal conductor to the substrate;

operably disposing the means for transferring force on the substrate; and placing the thermal conductor on the silicon die wherein the thermal conductor and the silicon die are in direct contact; wherein the means for transferring force and the thermal conductor are placed on the substrate substantially simultaneously.

* * * * *